(12) United States Patent
Reil et al.

(10) Patent No.: US 6,417,486 B1
(45) Date of Patent: Jul. 9, 2002

(54) PRODUCTION OF CONDUCTOR TRACKS ON PLASTICS BY MEANS OF LASER ENERGY

(75) Inventors: Frank Reil, Seeheim; Volker Pieper, Mainz; Kai-Uwe Tönnes, Köngernheim, all of (DE)

(73) Assignee: Ticona GmbH (DE)

( * ) Notice: Subject to any disclaimer, the term of this patent is extended or adjusted under 35 U.S.C. 154(b) by 0 days.

(21) Appl. No.: 09/982,439

(22) Filed: Oct. 18, 2001

Related U.S. Application Data

(63) Continuation of application No. 09/548,064, filed on Apr. 12, 2000.

(30) Foreign Application Priority Data

Apr. 12, 1999 (DE) .......................................... 199 16 467

(51) Int. Cl.⁷ ............................................... B23K 26/40
(52) U.S. Cl. ............................. 219/121.69; 219/121.66
(58) Field of Search ....................... 219/121.25, 121.29, 219/121.35, 121.85, 121.65, 121.66, 121.17; 29/846, 851

(56) References Cited

U.S. PATENT DOCUMENTS

| | | | |
|---|---|---|---|
| 3,056,881 A | * | 10/1962 | Schwarz |
| 4,159,414 A | | 6/1979 | Suh et al. |
| 4,524,098 A | * | 6/1985 | Shimizu et al. |
| 4,526,807 A | | 7/1985 | Auerbach |
| 4,608,129 A | | 8/1986 | Tamamura et al. |
| 4,794,087 A | | 12/1988 | Despax et al. |
| 4,841,099 A | | 6/1989 | Epstein et al. |
| 4,965,655 A | | 10/1990 | Grimmer et al. |
| 5,153,023 A | | 10/1992 | Orlowski et al. |
| 5,297,969 A | | 3/1994 | Mantell |
| 5,462,773 A | | 10/1995 | Swift et al. |
| 5,599,592 A | | 2/1997 | Laude |
| 5,955,179 A | | 9/1999 | Kickelhain et al. |

FOREIGN PATENT DOCUMENTS

| | | |
|---|---|---|
| DE | 40 08 215 | 9/1991 |
| EP | 0 340 997 | 11/1989 |
| EP | 0 476 320 | 3/1992 |

OTHER PUBLICATIONS

IBM Technical Disclosure Bulletin, Manufacture of Print Circuit Boards Using Suspended Conductive Material Bonded by Heat; vol. 38, No. 08, Aug. 1995, pp. 105–106, No Author Avail.

* cited by examiner

*Primary Examiner*—Tom Dunn
*Assistant Examiner*—Jonathan Johnson
(74) *Attorney, Agent, or Firm*—Connolly Bove Lodge & Hutz LLP

(57) ABSTRACT

A process for the production of electrically conductive layers on the surface of plastics in which the surface of a plastic filled with electrically conductive constituents is irradiated with laser energy in such a way that the plastic is evaporated down to a predetermined depth at the point of incidence by the laser energy, leaving behind the electrically conductive constituents, which increase in concentration and thus form an electrically conductive layer. With the aid of the process, plastic moldings with integrated electrically conductive layers or tracks on the surface can be produced, for example components used in the electrical and electronics industries or other large or small plastic parts of any desired shape which are provided with conductive elements in certain places. The molding can also be a constituent of a composite article with other materials.

10 Claims, No Drawings

PRODUCTION OF CONDUCTOR TRACKS ON PLASTICS BY MEANS OF LASER ENERGY

This application is a continuation in part of Ser. No. 09/548,064, filed on Apr. 12, 2000.

The present invention relates to a process for the formation of electrically conductive layers, in particular conductor tracks, on the surface of plastics by irradiation with laser energy.

Plastic moldings with integrated electrically conductive layers or tracks are well known, for example from the electrical and electronics industries.

However, in order to apply conductor tracks to plastics, metallizable plastics have hitherto been arranged in complex, multi-step processes in such a way that conductor tracks are formed by partial metallization (electroplating). Another possibility is to apply conductor tracks to the plastic surface by hot embossing.

The processes disclosed hitherto for the production of plastic moldings with integrated conductor tracks are very expensive and in some cases not very environmentally friendly, and consequently alternative possibilities are being sought. The irradiation of molding compositions containing fillers with laser energy represents such an alternative possibility.

The marking of plastics filled with conductive constituents is described in DE-A 44 15 802. In the described use of doped tin dioxide, mica plates or silicon dioxide flakes, markings can be produced by irradiation with laser energy, but conductor tracks cannot.

U.S. Pat. No. 4,841,099 describes the production of electrical conductor tracks in a plastic filled with non-conductive fibers. These fibers, preferably polyacrylonitrile fibers, are converted into conductive carbon fibers on irradiation with appropriate laser energy. However, disadvantages here are the lower conductivity of carbon compared with metals and the restrictions associated with the use of plastic fibers as fillers in another plastic.

EP-A 0 230 128 describes the production of conductor tracks on pyrolyzable substrates by irradiation with appropriate laser energy. This results in the formation of conductive carbon tracks, which can, if desired, be coated with a suitable metal layer by electrolysis. However, disadvantages here are the restriction to suitable plastics and the low conductivity of the carbon, resulting in the necessity for subsequent coating of the conductor track with metal.

The object of the present invention was to produce conductor tracks close to the surface of a substantially electrically insulating plastic.

This object is achieved by irradiation of a plastic which is filled with electrically conductive constituents, but is itself substantially electrically insulating, with appropriate laser energy.

In this process, the surface of a plastic which is filled with electrically conductive constituents is irradiated with laser energy. The irradiation causes the plastic to partially evaporate, leaving behind the electrically conductive constituents, which combine to form an electrically conductive layer or track.

The invention therefore relates to a process for the production of electrically conductive layers on the surface of plastics in which the surface of a plastic filled with electrically conductive constituents is irradiated with laser energy in such a way that the plastic is evaporated down to a predetermined depth at the point of incidence by the laser energy, leaving behind the electrically conductive constituents, which increase in concentration and thus form an electrically conductive layer.

The invention also relates to plastic moldings with integrated electrically conductive layers or tracks on their surface which can be obtained by irradiation of a plastic filled with electrically conductive constituents with laser energy, where the plastic is evaporated down to a predetermined depth at the point of incidence by the laser energy, leaving behind the electrically conductive constituents, which increase in concentration and thus form an electrically conductive layer or track.

Moldings of this type can be components used, for example, in the electrical and electronics industries, but also other large or small plastic parts of any desired shape which are provided with conductive elements in certain places. The molding according to the invention can also be a constituent of a composite article with other materials.

Since the plastic which is filled with electrically conductive constituents may differ in its chemical and in particular its mechanical properties from the same plastic without these constituents and may also be somewhat more expensive, it may be appropriate, in particular in the case of relatively large moldings, to produce the body of the molding and certain elements on which conductive layers or tracks are desired as a composite made from different molding compositions.

With respect to the plastic to be used in accordance with the invention, no particular restriction is necessary. For the process according to the invention, use can in principle be made of all organic plastics into which the electrically conductive constituents can be incorporated in sufficient amounts. These plastics can also contain conventional auxiliaries, additives, fillers and reinforcing materials. Homogeneous and heterogeneous plastic mixtures can also be used.

The plastics to be used in the process according to the invention are plastics which are not crosslinked, in particular thermoplastics which are not crosslinked. For certain purposes such plastics may be crosslinked after they have been used to form a shaped article and have been equipped with conductor tracks on its surface by the process according to the invention. They may, for example, be photocrosslinked or by other means which will not affect the present conductor tracks.

Preferred plastics are thermoplastics.

Usually, thermoplastic elastomers are less suitable because they are more elastic than the conductor tracks produced thereon, so usage of these materials in their typical field of use may result in break of the conductor tracks, although the invention may be carried out with such materials as well. Such thermoplastic elastomers are, for example, but not restricted to brominated Butyl rubbers, chlorinated Butyl rubbers, polyurethane elastomers, fluoroelastomers, polyester elastomers, polyvinylchloride, butadiene/acrylonitrile elastomers, silicon elastomers, polybutadiene, polyisobutylene, ethylene-propylene-copolymers, ethylene-propylene-dien-terpolymers, sulfonated ethylene-propylene-dien terpolymers, polychloroprene, poly(2,3-dimethylbutadiene), poly(butadiene-pentadiene), chlorosulfonated polyethylene, polysulfide-elastomers, block copolymers, constructed from segments of amorphous or (partially)cristalline blocks such as polystyrene, polyvinyltoluene, poly(tert.-butyl styrene), polyester and similar, and elastomeric blocks such as polybutadiene, polyisoprene, ethylene-propylene-copolymers, ethylene-butylene-copolymers, ethylene-isoprene-copolymers and hydrated derivatives thereof, such as SEBS, SEPS, SEEPS, and also hydrated ethylene-isoprene-copolymers with an increased fraction of 1,2-connected isoprene, polyethers or similar, such as. for example the products sold by Kraton Polymers under the trademark KRATON®, derivatives and/or mixtures thereof.

Preferred thermoplastics are thermoplastics which are drived from, or mixtures of, the following materials:

Polylactones such as Poly(pivalolactone), Poly(caprolactone) or similar; Polyurethanes such as polymerisation products of diisocyanates such as 1,5-Naphthalin-diisocyanate; p-Phenylen-diisocyanate, m-Phenylene-diisocyanate, 2,4-Toluyl-diisocyanate, 2,6-Toluylene-diisocyanate, 4,4'-Diphenylmethane-diisocyanate, 3,3'-Dimethyl-4,4'-Biphenyl-diisocyanate, 4,4'-Diphenylisopropylidene-diisocyanate, 3,3'-Dimethyl4,4'-diphenyl-diisocyanate, 3,3'-Dimethyl-4,4'-diphenylmethane-diisocyanate, 3,3'-Dimethoxy-4,4'-biphenyl-diisocyanate, Dianisidine-diisocyanate, Toluidine-diisocyanate, Hexamethylene-diisocyanate, 4,4'-Diisocyanatodiphenylmethane, 1,6-Hexamethylene-diisocyanate, 4,4'-Dicyclo-hexylmethane-diisocyanate or similar with long chain diols such as Poly(tetramethylene adipate), Poly(ethylene adipate), Poly(1,4-butylene adipate), Poly(ethylene succinate), Poly(2,3-butylene succinate), Polyether dioles and/or one or more diols like Ethyleneglycole, Propyleneglycole and/or a polydiol such as diethyleneglycole, triethyleneglycole and/or tetraethyleneglycole or similar;

Polycarbonates such as Poly[methane bis(4-phenyle) carbonate], Poly[1 ,1-ether bis(4-phenyl) carbonate], Poly[diphenylmethane bis(4-phenyl)carbonate], Poly[1,1-cyclohexane bis(4-phenyl) carbonate] and/or similar;

Polysulfones such as the reaction product of the sodium salt of 2,2-Bis(4-hydroxyphenyl) propane or des 4,4'-Dihydroxydiphenylether with 4,4'-Dichlorodiphenylsulfone and/or similar;

Polyethers, Polyketones and Polyetherketones such as polymerisation products of hydrochinones, of 4,4'-Dihydroxybiphenyls, of 4,4'-Dihydroxybenzophenone or of 4,4'-Dihydroxydiphenylsulfone with dihalogenated, particularly difluorinated or dichlorinated aromatic substances of the type 4,4'-Di-halo-diphenylsulfone, 4,4'-Di-halo-25 dibenzophenone, Bis-4,4'-di-halobenzoyl-benzene, 4,4'-Di-halo-biphenyl and/or similar;

Polyamides such as Poly(4-amino butanoate), Poly(hexamethylene adipamide), Poly(6-aminohexanoate), Poly(m-xylylene adipamide), Poly(p-30 xylylene sebacamide), Poly(2,2,2-trimethyl hexamethylene terephthalamide), Poly(metaphenylen isophthalamide) (NOMEX), Poly(p-phenylene terephthalamide), and or similar;

Polyesters auch as Poly(ethylene acetate), Poly(ethylene-1,5-naphthalate, Poly(1,4-cyclohexandimethylene terephthalate), Poly(ethylen oxybenzoate) (A-TELL), Poly(parahydroxy benzoate) (EKONOL), Poly(1,4-cyclohexylidene-dimethylene terephthalate) (KODEL) (cis)Poly(1,4-cyclohexylidene-dimethylene terephthalate) (Kodel), Polyethylenterephthalate, Poly-butylenterephthalate and/or similar;

Poly(aryleneoxide) such as Poly(2,6-dimethyl-1,4-phenylene oxide), Poly(2,6-diphenyl-1,4-phenylene oxide) and/or similar;

Liquid cristalline polymers such as polykondensation products of monomers of the group consisting of terephthalic acid, isophthalic acid, 1,4-naphthalinedicarboxylic acid, 2,6-Napthalinedicarboxylic acid, 4,4'-Biphenyidicarboxylic acid, 4-Hydroxybenzoic acid, 6-Hydroxy-2-naphthalindicarboxylic acid, Hydrochinone, 4,4'-Dihydroxybiphenyl, 4-Aminophenol and/or similar;

Poly(arylene sulfide) such as Poly(phenylenesulfide), Poly(phenylene-sulfide-ketone), Poly(phenylene-sulfide-sulfone) and/or similar;

Polyetherimides;

Vinyl polymers and theyr Copolymers such as Polyvinyl acetate, Polyvinyl chloride; Polyvinylbutyrale, Polyvinylidene chloride, Ethylene-vinyl acetate Copolymers and/or similar;

Polyacrylate derivatives, Polyacrylates and Copolymere thereof, such as Polyethylacrylate, Poly(n-butyl acrylate), Polymethylmethacrylate, Polyethylmethacrylate, Poly(n-butyl methacrylate), Poly(n-propyl methacrylate), waterinsoluble ethylene-acrylic acid copolymers, waterinsoluble ethylene-vinyl alcohol copolymers, Acrylonitrile-copolymers, methylmethacrylate-styrene copolymers, ethylene-ethylacrylate copolymers, acryl-butadiene-styrene copolymers and/or similar;

Polyolefins such as Low Density Poly(ethylene), Poly(propylene), chlorinates Low Density Poly(ethylene), Poly(4-methyl-1-pentene), Poly(ethylene), Poly(styrene), and/or similar;

waterinsoluble ionomers; poly(epichlorhydrine);

Furan polymers such as Poly(furane);

Cellulose esters such as celluloseacetate, celluloseacetate-butyrate, cellulosepropionate and/or similar;

silicones such as poly(dimethyl siloxane), poly(dimethyl siloxane-co-phenylmethyl siloxane) and/or similar; and protein thermoplastics.

The Polyester materials used comprise thermoplastic polyesters which contain polymerized units deriving from an ester of at least one aromatic dicarboxylic acid, in particular from terephthalic acid, isophthalic acid or 2,6-naphthalenedicarboxylic acid and from at least one aliphatic diol, in particular ethylene glycol 1,3-propanediol or 1,4-butanediol, or which contain polymerized units of tetrahydrofuran. Examples of suitable polyesters according to the invention are described in Ullmann's Encyclopedia of Ind. Chem., ed. Barbara Elvers, Vol. A24, Polyester section (pp. 227–251) VCH Weinheim-Basel-Cambridge-New-York (1992), which is incorporated by reference for all useful purposes. Particular preference is given to polyesters such as polyethylene terephthalate or polybutylene terephthalate and to copolyesters containing butylene terephthalate units and butylene isophthalate units.

The polyesters may also have been modified by incorporating, during the condensation, small amounts of aliphatic dicarboxylic acids, such as, but not limited to glutaric acid, adipic acid or sebacic acid, or of polyglycols, such as, but not limited to diethylene glycol or triethylene glycol, or else higher-molecular-weight polyethylene glycols. The polyesters may also contain other polymerized units derived from hydroxycarboxylic acids, preferably from hydroxybenzoic acid or from hydroxynaphthalenecarboxylic acid.

Polycarbonates are known materials and are described, for example, in Saechtling, Kunststoff-Taschenbuch, $27_{th}$ edition 1998, Hanser Verlag, on pages 479 to 485. Polycarbonates can for example be prepared by reaction of bisphenol A with phosgene, or melt condensation of diphenyl carbonate with bisphenol A. Possible comonomers used are also bisphenol TMC and bisphenol S (Dihydroxydiphenylsulfide). The flame retardance of these materials may be improved by using a halogenated bisphenol derivative, in particular a brominated bisphenol derivative.

Polycarbonates suitable usually have the general formula

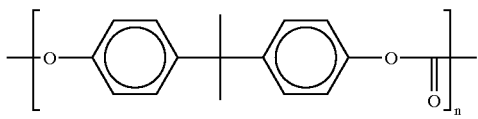

And may also comprise repeating units

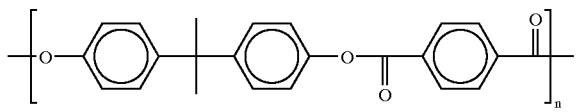

n is greater than one, preferably between 2 and 10.000. Most preferably, n is in such a range that the mean molecular weight of the polymer does not exceed 30.000 g/mole.

The materials may comprise bisphenol moieties which are substituted either on the aromatic ring, for example with bromine, or may carry different aliphatic rests on the carbon atom connecting the aromatic rings (bisphenol TMC comprising materials), or the aromatic rings may be connected with a heteroatom, for example sulfur (bisphenol S comprising materials).

The polyamides which are suitable according to the invention are described for example, in Saechtling, Kunststoff-Taschenbuch, 27$^{th}$ edition 1998, Hanser Verlag, on pages 465 to 478. Polyamides usually have the general formula

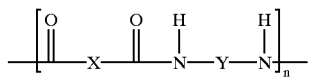

wherein X and Y are the same or different and may be an aromatic or aliphatic radical. The aromatic radical used are generally substituted in meta or para position. Aliphatic radicals are generally linear and not branched or cyclic, although such materials can be prepared and used. Preferably, the aliphatic radicals are linear, non-branched radicals having 4 to 13 carbon atoms. Particularly preferably are materials in which X is a linear, aliphatic radical having 4, 7, 8 or 10 carbon atoms and wherein Y is a linear, aliphatic radical having 4 or 6 carbon atoms. In a further preferred embodiment X is a phenyl rest which is substituted in para or meta position and Y is a linear, aliphatic radical having 6 carbon atoms, or in which Y is a 2,2,-dimethyl-4-methylhexyl rest. n is greater t ran one, preferably between 2 and 1000, particularly between 80 and 100.

Further preferred polyamides have the general formula

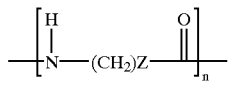

wherein Z is 5, 10 and 11 and n is greater t an one, preferably between 2 and 1000, particularly between 80 and 100.

The properties of such materials as well as their preparation are generally known to a person skilled in the art.

Materials of particular preference are thermoplastics which have a comparably lo w ceiling temperature, preferably a ceiling temperature of less than 300° C., preferably less than 200° C. The ceiling temperature is known to be the temperature at which a polymer is no longer thermodynamically stable; for Polymethylmethacrylate for example, this temperature is at about 178° C. Such materials are generally known to the artisan, readily available and widely used in several applications. The particular advantage of these materials is that they will more easily undergo depolymerization under heat, in the process according to the invention this heat is caused by means of irradiation with laser energy. In this way the polymer can be depolymerized by the laser energy, and the resulting monomer will be easily evaporated, or is even gaseous at room temperature, like for example formaldehyde.

Such materials are, for example, polyacetal copolymers, polyacetal homopolymers, polyacrylates such as Polymethylmethacrylate, Polyethylmethacrylate, Polymethylacrylate, Polyethylcrylate, and copolymers thereof.

According to the invention, the materials may also contain constituents which promote the depolymerization. Those constituents will preferably not affect the other material properties. An agent promoting depolymerization may also be applied to the surface of the shaped article before irradiation with laser light for example by spraying a solution of such agent onto the surface. In a further embodiment of the invention said agent may be removed after irradiation with laser energy and the production of the conductor tracks, for example by washing. For example, polyacetal could be supplied with a solution comprising acidous constituents wich is washed off after irradiation.

In further preferred embodiments of the present invention the thermoplastics employed are polyacetal homo- and/or copolymers, polyesters, such as polyethylene terephthalate or polybutylene terephthalate or mixtures thereof, polyamides, polycarbonates, styrene-acrylonitrile copolymers, polyolefins such as polyethylene, polypropylene or ethylene-norbornene-copolymers, liquid crystalline polymers, polyarylene sulfide, or mixtures thereof.

The plastic may also comprise constituents promoting the absorption of laser light, sun h as dyes or pigments.

The wavelength and intensity of the incident laser light should be adjusted depending on the type of plastic used. In particular, the requisite irradiation duration and thus the achievable processing speed are dependent thereon. Transparent plastics and those without a significant content of absorbent constituents enable a greater irradiation depth. Plastics having a relatively high content of constituents which absorb the energy of the laser light result in greater heating of the plastic surface at the point of incidence. This can, for example, accelerate evaporation of the plastic material or promote intermelting of the electrically conductive constituents with one another.

Materials which are used in accordance with the invention as electrically conductive constituents are generally of a metallic nature or come under the carbon blacks and graphites. Examples of preferred metals are tin, silver and copper, which can be employed individually, as an alloy and in combination with other electrically conductive materials. The metallic constituents can be in any desired particle shape, for example as a powder, spherical or fibrous. Mention should also be made here of, in particular, steel fibers, which are frequently employed as reinforcing materials.

Conductive blacks and graphites are well known and can be used alone, in combination with one another or together with other conductive materials. Explicitly excluded as electrically conductive constituents are constituents which are not conductive by itself and have to change their conductivity during the process. These are, for example, metal oxides which will be reduced to metal, other non-conductive metal compounds which will change to elementary metal or a conductive metal compound throughout the process, polyacrylonitrile fibers which may become carbon fibers on heating, or mesoscopic particles.

The proportion of electrically conductive constituents in the matrix of the plastic to be used in accordance with the invention should generally be selected in such a way that the plastic itself still has insulating properties. Only through irradiation of the surface and the associated partial evaporation of the plastic matrix is the content of electrically conductive constituents there increased to a conducting concentration. The achievable conductivity here depends on the type and concentration of the electrically conductive materials and on the thickness of the conductive layer or track formed.

Ideally, the electrically conductive constituents are intermelted with one another by th laser energy, so that a continuous electrically conductive track is formed. This intermelting can also be effected by re-irradiation in a subsequent process step. It is also possible to intermelt the electrically conductive layer with the plastic matrix by re-irradiation. In both cases, the energy of the laser light can be optimized in relation to the effect to be achieved.

The conductive constituents may, in general, be incorporated into the plastic by an means suitable. Preferably, the conductive constituent will be incorporated into the thermoplastic by melting it in a suitable mixing aggregate, combined with conductive constituents, mixed and discharged from the mixing aggregate. The mixing aggregate employed may be any apparatus suitable therefore. Suitable apparatuses and processes are known to the artisan and commonly used. Suitable apparatuses and processes are for example, described in: Saechtling, Kunststoff-Taschenbuch, Hanser-Verlag, 27. Edition 1998, on pages 202 to 217, which is incorporated by reference for all useful purposes. Incorporating the conductive constituents may be carried out in kneaders, for example Brabender kneaders. In a preferred embodiment of the invention the mixing aggregate is a crew apparatus. In a particularly preferred embodiment the screw machine is an extruder, in particular a twin screw extruder.

The conductive constituents may also be incorporated into the plastic by dissolving the plastic in a suitable solvent and mixing this solution with conductive constituents. The resulting suspension may be used as a coating composition, applied to a substrate and allowed to solidify, preferably by drying, and yields a solid coating. The conductor tracks may then be manufactured thereon as described.

The shaped articles may be produced by any process suitable for this purpose. Suitable processes are described, for example, in Saechtling, Kunststoff-Taschenbuch, Hanser-Verlag, 27. edition 1998 on pages 201 to 369, which is incorporated by reference for all useful purposes. Preferably, the shaped articles are produced by means of injection molding, by means of extrusion or by means of compression molding. The references mentioned herein are incorporated by reference for all useful purposes.

The working example described below is intended to explain the invention and the advantages achieved thereby in greater detail to the person skilled in the art.

EXAMPLE 1

5% by volume of electrically conductive particles based on tin, silver or copper were incorporated into the plastic matrix of a commercially available polybutylene terephthalate by extrusion. The plastic obtained acted as an insulator.

A molding was produced from the resultant plastic by injection molding. A line-shaped part thereof was irradiated using a NdYAG laser. The laser energy caused the polymer to evaporate, and the electrically conductive particles accumulated at the surface of the line. This line was immediately thereafter again exposed to laser energy.

Contacts were stamped into the plastic surface at the end points of the line. The conductivity of the resultant conductor track was confirmed by means of an ammeter/voltmeter.

What is claimed is:

1. A process for the production of electrically conductive layers on the surface of plastics, in which the surface of a plastic containing electrically conductive constituents is irradiated with laser energy in such a way that the plastic is evaporated down to a predetermined depth at the point of incidence by the laser energy, leaving behind the electrically conductive constituents, which increase in concentration and thus form an electrically conductive layer.

2. The process as claimed in claim 1, wherein the electrically conductive constituents which are left behind are intermelted with one another by the laser energy.

3. The process as claimed in claim 1, wherein the electrically conductive constituents which are left behind are intermelted with the newly formed plastic surface by the laser energy at the point of incidence.

4. The process as claimed in claim 1, wherein the plastic is a thermoplastic.

5. The process as claimed in claim 1, wherein the thermoplastic has a ceiling temperature of below 300° C.

6. The process as claimed in claim 1, wherein the thermoplastic is selected from the group consisting of polyacetal homo- and/or copolymers, polyesters, polyethylene terephthalate, polybutylene terephthalate, polyamides, polycarbonates, styrene-acrylonitrile copolymers, polyolefins, liquid crystalline polymers, polyarylene sulfide and mixtures thereof.

7. The process as claimed in claim 6, wherein the polyolefins include polyethylene , polypropylene and ethylene norbornene-copolymers.

8. The process as claimed in claim 1, wherein the plastic is in the form of a shaped article obtained by means of extrusion, compression molding or injection molding.

9. A process for the production of plastic shaped articles, wherein a thermoplastic is molten, at least one conductive constituent incorporated in a mixing aggregate, discharging the resulting mixture from the mixing aggregate, manufacturing a shaped article from the resulting mixture, irradiating the surface of the shaped article with laser energy in such a way that the plastic is evaporated down to a predetermined depth at the point of incidence by the laser energy, leaving behind the electrically conductive constituents, which increase in concentration and thus form an electrically conductive layer.

10. A process for the production of plastic shaped articles, wherein a plastic is dissolved in a solvent to form a resulting solution, mixing the resulting solution with at least one conductive constituent, applying the solution to a plastic surface, allowing the solution to solidify, irradiating the surface of the plastic containing electrically conductive constituents with laser energy in such a way that the plastic is evaporated down to a predetermined depth at the point of incidence by the laser energy, leaving behind the electrically conductive constituents, which increase in concentration and thus form an electrically conductive layer.

* * * * *